United States Patent [19]
Gardner et al.

[11] Patent Number: 6,027,964
[45] Date of Patent: Feb. 22, 2000

[54] METHOD OF MAKING AN IGFET WITH A SELECTIVELY DOPED GATE IN COMBINATION WITH A PROTECTED RESISTOR

[75] Inventors: Mark I. Gardner, Cedar Creek; Daniel Kadosh; Michael Duane, both of Austin, all of Tex.

[73] Assignee: Advanced Micro Devices, Inc., Sunnyvale, Calif.

[21] Appl. No.: 08/905,681

[22] Filed: Aug. 4, 1997

[51] Int. Cl.⁷ .................. H01L 21/8234; H01L 21/266
[52] U.S. Cl. ................ 438/238; 438/383; 438/303; 257/350; 257/379
[58] Field of Search .................. 438/238, 383, 438/382, 286, 210, 241, 301, 303, 385, 386; 257/339

[56] References Cited

U.S. PATENT DOCUMENTS

| | | | |
|---|---|---|---|
| 4,309,626 | 1/1982 | Kudo | 327/564 |
| 4,329,186 | 5/1982 | Kotecha et al. | 438/286 |
| 4,356,622 | 11/1982 | Widmann | 438/289 |
| 4,558,507 | 12/1985 | Okabayashi et al. | 438/301 |
| 5,234,853 | 8/1993 | Ikemasu | 438/241 |
| 5,260,595 | 11/1993 | Hayama | 257/379 |
| 5,286,664 | 2/1994 | Horiuchi | 438/286 |
| 5,316,964 | 5/1994 | Gross | 438/383 |
| 5,424,229 | 6/1995 | Oyamatsu | 438/286 |
| 5,444,024 | 8/1995 | Anjum et al. | 438/303 |
| 5,512,769 | 4/1996 | Yamamoto | 257/339 |
| 5,550,084 | 8/1996 | Anjum et al. | 438/664 |
| 5,591,650 | 1/1997 | Hsu et al. | 438/154 |
| 5,656,518 | 8/1997 | Gardner et al. | 438/286 |
| 5,741,737 | 4/1998 | Kachelmeier | 438/286 |
| 5,773,339 | 6/1998 | Okamoto | 438/210 |

OTHER PUBLICATIONS

Ng, Kwok K., "Complete Guide to Semiconductor Devices," published by McGraw–Hill, Inc., New York, 1995, pp. 105–106.

Wolf, Stanley, "Silicon Processing for the VLSI Era, vol. 2: Process Integration," published by Lattice Press, Sunset Beach, CA, 1990, pp. 733–736.

Streetman, Ben G., "Solid State Electronic Devices," Fourth Edition, published by Prentice Hall, Englewood Cliffs, NJ, 1995, pp. 353–355.

U.S. Patent Application Serial No. 08/695,101, Aug. 7, 1996, entitled: "Selectively Doped Channel Region For Increased Idsat And Method For Making Same", by Gardner et al. (copy not enclosed).

U.S. Patent Application Serial No. 08/787,036, filed Jan. 28, 1997, entitled: "Method Of Making An IGFET With A Non–Uniform Lateral Doping Profile In The Channel Region", by Gardner et al. (copy not enclosed).

Primary Examiner—Wael Fahmy
Assistant Examiner—William David Coleman
Attorney, Agent, or Firm—Skjerven, Morrill, Macpherson, Franklin & Friel, L.L.P.; William W. Holloway

[57] ABSTRACT

A method of making an IGFET with a selectively doped gate in combination with a protected resistor includes the steps of providing a semiconductor substrate with an active region and a resistor region, forming a gate over the active region, forming a diffused resistor in the resistor region, forming an insulating layer over the active region and the resistor region, forming a masking layer over the insulating layer that includes an opening above a first portion of the gate and covers the resistor region and a second portion of the gate, applying an etch using the masking layer as an etch mask to remove the insulating layer above the first portion of the gate so that an unetched portion of the insulating layer forms a gate-protect insulator over the second portion of the gate and another unetched portion of the insulating layer forms a resistor-protect insulator over the diffused resistor, and forming a source and a drain in the active region including at least partially doping the source and the drain during a doping step that provides more doping for the first portion of the gate than for the second portion of the gate after forming the masking layer. In this manner, the masking layer can provide both an etch mask for the resistor-protect insulator and an implant mask for selectively doping the gate.

33 Claims, 8 Drawing Sheets

METHOD OF MAKING AN IGFET WITH A SELECTIVELY DOPED GATE IN COMBINATION WITH A PROTECTED RESISTOR

BACKGROUND OF THE INVENTION

1. Field of the Invention

The present invention relates to integrated circuit manufacturing, and more particularly to a method of making insulated-gate field-effect transistors and diffused resistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide the gate. Thereafter, the gate provides an implant mask during the implantation of source and drain regions, and the implanted dopants are driven-in and activated using a high-temperature anneal that would otherwise melt the aluminum.

As IGFET dimensions are reduced and the supply voltage remains constant (e.g., 3V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to spacers adjacent to the gate. The spacers are typically oxides or nitrides. The purpose of the lighter dose is to form a lightly doped region of the drain (or LDD) at the edge near the channel. The heavier dose forms a low resistivity heavily doped region of the drain. Since the heavily doped region is farther away from the channel than a conventional drain structure, the depth of the heavily doped region can be made somewhat greater without adversely affecting the device characteristics. A known fabrication sequence includes forming lightly doped source/drain regions, forming the spacers, and then forming heavily doped source/drain regions. Another known fabrication sequence includes forming disposable spacers, forming heavily doped source/drain regions, removing the disposable spacers, and then forming lightly doped source/drain regions (between the heavily doped source/drain regions and the gate).

Disadvantages of LDDs include increased fabrication complexity and increased parasitic resistance due to their light doping levels. During operation, LDD parasitic resistance decreases drain current. Linear drain current (in the linear or triode region) is reduced by the parasitic resistance in both the source and drain. Saturation drain current (in the saturation region) is largely unaffected by the parasitic resistance of the drain but greatly reduced by the parasitic resistance of the source. Therefore, saturation drain current can be improved while reducing hot carrier effects by providing a lightly doped region only on the drain side. That is, the drain includes lightly and heavily doped regions, and the entire source is heavily doped.

Asymmetrical IGFETs (with asymmetrically doped sources and drains) are known in the art. For instance, U.S. Pat. No. 5,424,229 entitled "Method For Manufacturing MOSFET Having An LDD Structure" by Oyamatsu discloses providing a mask with an opening over a substrate, implanting a dopant through the opening at an angle to the substrate to form a lightly doped drain region on one side without a corresponding source region on the other side, forming a gate in the opening which overlaps the lightly doped drain region, removing the mask and implanting heavily doped source and drain regions using the gate as an implant mask. As another example, U.S. Pat. No. 5,286,664 entitled "Method For Fabricating The LDD-MOSFET" by Horiuchi discloses forming a gate, implanting lightly doped source and drain regions using the gate as an implant mask, forming a photoresist layer that covers the source side and exposes the drain side, depositing a single spacer on the drain side using liquid phase deposition (LPD) of silicon dioxide, stripping the photoresist, and implanting heavily doped source and drain regions using the gate and single spacer as an implant mask.

An important parameter in IGFETs is the threshold voltage ($V_T$), which is the minimum gate voltage required to induce the channel. In general, the positive gate voltage of an N-channel device must be larger than some threshold voltage before a conducting channel is induced, and the negative gate voltage of a P-channel device must be more negative than some threshold voltage to induce the required positive charge (mobile holes) in the channel. There are, however, exceptions to this general rule. For example, depletion-mode devices already have a channel with zero gate voltage, and therefore are normally on. With N-channel depletion-mode devices a negative gate voltage is required to turn the devices off, and with P-channel depletion-mode devices a positive gate voltage is required to turn the devices off If the source and body of an IGFET are tied to ground, the threshold voltage can be calculated as follows:

$$V_T = \phi_{ms} - 2\phi_f - Q_{tot}/C_{ox} - Q_{BO}/C_{ox} - \Delta V_T \qquad (1)$$

where $\phi_{ms}$ the work-function difference between the gate material and the bulk silicon in the channel, $\phi_f$ is the equilibrium electrostatic potential in a semiconductor, $Q_{tot}$ is the total positive oxide charge per unit area at the interface between the oxide and the bulk silicon, $C_{ox}$ is the gate oxide capacitance per unit area, $Q_{BO}$ is the charge stored per unit area in the depletion region, and $\Delta V_T$ is a threshold lowering term associated with short-channel effects. Expressions have been established for these various quantities in terms of doping concentrations, physical constants, device structure dimensions, and temperature. For example, the work-function difference $\phi_{ms}$ varies as a function of the doping concentration in a polysilicon gate. Therefore, the threshold voltage depends on the doping concentration in the polysilicon gate.

Providing low resistance contacts for the gate, source and drain can be accomplished using refractory metal silicide. In one approach, a thin layer of refractory metal is deposited over the structure after forming the lightly doped source/drain regions and the spacers and the heavily doped source/drain regions, and heat is applied to form silicide contacts wherever the refractory metal is adjacent to silicon (including single crystal silicon and polysilicon). Thereafter, an etch is applied that removes unreacted refractory metal over the spacers to prevent bridging silicide contacts for the gate, source and drain. Various silicides, including PtSi, $MoSi_2$, $CoSi_2$ and $TiSi_2$ have been used for this purpose. For instance, the sheet resistance of titanium silicide ($TiSi_2$) is as low as 3 to 6 Ω/sq, whereas heavily doped polysilicon exhibits a sheet resistance on the order of 15 to 30 Ω/sq. Another advantage to this approach is that the silicide contacts for the gate, source and drain are formed simultaneously and are self-aligned by the spacers. This self-aligned silicide is sometimes referred to as "salicide."

After the silicide contacts are formed, typically an oxide layer is formed over the device, contact windows are etched in the oxide layer to expose the silicide contacts, one or more layers of metallization are deposited over the oxide layer and into the contact windows, the metallization above the oxide layer is removed to form metal plugs in the contact windows, and a metal-1 pattern is formed on the oxide layer that selectively interconnects the plugs. Additional interlevel dielectrics, metal plugs and overlying metal patterns (such as metal-2 through metal-5) can be formed in a similar manner.

Resistors can be classified as those fabricated in integrated circuits and as discrete components. Integrated resistors can be further classified as diffused resistors, thin-film resistors, epitaxial resistors, and pinch resistors. Diffused resistors are formed by doping or counterdoping a region of the semiconductor substrate, for instance by ion implantation or solid phase diffusion. Thin-film resistors are typically polysilicon, amorphous silicon, or metal alloys such as silicides. Epitaxial resistors are a region of an epitaxial surface layer of a substrate. Pinch resistors are a by-product of bipolar technology (or JFET technology) where the base-layer is pinched by the top emitter diffusion.

Diffused resistors in npn bipolar processes are formed by using the shallow diffusion for the transistor base and emitter regions, or by using doped epitaxial regions. In NMOS and PMOS processes, diffused resistors are formed using process steps that dope the source/drain regions. In complementary metal-oxide semiconductor (CMOS) processes, the N-well and P-well masks can be configured so that diffused resistors are formed by the well implants, punchthrough implants, and threshold adjust implants. The resistance of diffused resistors depends on the length, width, depth and sheet resistance of the diffusion, which are generally known with good accuracy. Design criteria for diffused resistors also include geometric factors, such as rounding corners subject to high current density.

A resistor-protect insulator is usually formed over a diffused resistor before depositing a refractory metal over the substrate. Otherwise, silicide would form on the entire the diffused resistor and render it useless. Typically, the resistor-protect insulator is formed after forming the source and drain by depositing an insulating layer over the substrate, forming a photoresist layer on the insulating layer, etching the insulating layer and removing the photoresist layer.

In semiconductor manufacturing, it is highly desirable to reduce the number of process steps. Accordingly, a need exists for an improved method of making an IGFET and a protected resistor with a reduced number of process steps, particularly where the method provides a lightly doped drain, silicide contacts for the gate, source and drain, selective doping for the gate in order to precisely control the threshold voltage, and the flexibility to form symmetrical or asymmetrical devices.

SUMMARY OF THE INVENTION

An object of the invention is to provide an improved method of making an IGFET with a selectively doped gate in combination with a protected resistor using a reduced number of processing steps. Generally speaking, this is accomplished by using a single masking layer to define both the resistor-protect insulator and the portion of the gate that shall be exposed to a subsequent source/drain doping step.

In accordance with one aspect of the invention, a method of making an IGFET with a selectively doped gate in combination with a protected resistor includes the steps of providing a semiconductor substrate with an active region and a resistor region, forming a gate over the active region, forming a diffused resistor in the resistor region, forming an insulating layer over the active region and the resistor region, forming a masking layer over the insulating layer that includes an opening above a first portion of the gate and covers the resistor region and a second portion of the gate, applying an etch using the masking layer as an etch mask to remove the insulating layer above the first portion of the gate so that an unetched portion of the insulating layer forms a gate-protect insulator over the second portion of the gate and another unetched portion of the insulating layer forms a resistor-protect insulator over the diffused resistor, and forming a source and a drain in the active region including at least partially doping the source and the drain during a doping step that provides more doping for the first portion of the gate than for the second portion of the gate after forming the masking layer.

A first embodiment of the method includes implanting lightly doped source and drain regions into the active region using the gate as an implant mask for the active region, forming first and second spacers adjacent to opposing sidewalls of the gate, depositing the insulating layer, forming the masking layer, forming the gate-protect insulator and the resistor-protect insulator, and implanting heavily doped source and drain regions into the active region using the first spacer and the first portion of the gate and the masking layer as an implant mask for the active region and using the masking layer as an implant mask for the second portion of the gate and the diffused resistor. In this manner, the lightly doped source and drain regions provide channel junctions for a symmetrical device.

A second embodiment of the method includes implanting lightly doped source and drain regions into the active region using the gate as an implant mask for the active region, depositing the insulating layer, forming the masking layer, forming the gate-protect insulator and the resistor-protect insulator, and implanting heavily doped source and drain regions into the active region using the first portion of the gate and the masking layer as an implant mask for the active region and using the masking layer as an implant mask for the second portion of the gate and the lightly doped drain region and the diffused resistor. In this manner, the heavily doped source region and the lightly doped drain region provide channel junctions for an asymmetrical device.

The diffused resistor can be formed during a well implant before implanting the lightly doped source and drain regions, or alternatively the diffused resistor can be formed as the lightly doped source and drain regions are implanted. The masking layer can provide an implant mask for the diffused resistor as the heavily doped source and drain regions are implanted, or alternatively the masking layer can be stripped and the resistor-protect insulator can provide an implant mask for the diffused resistor as the heavily doped source and drain regions are implanted.

Thereafter, silicide contacts can be formed on the gate, source and drain, in which case the resistor-protect insulator prevents underlying silicide formation on the diffused resistor.

As exemplary materials, the gate is polysilicon, the resistor-protect insulator and the spacers are different materials selected from the group consisting of silicon dioxide, silicon nitride, silicon oxynitride and combinations thereof, the masking layer is photoresist, and the silicide contacts are titanium silicide.

Advantageously, the masking layer can provide both an etch mask for the resistor-protect insulator and an implant mask for selectively doping the gate.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
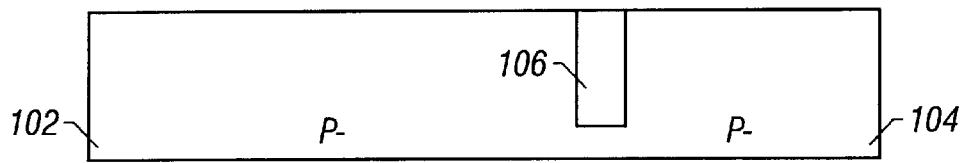
FIGS. 1A–1O show cross-sectional views of successive process steps for making an IGFET with a selectively doped gate in combination with a protected resistor in accordance with a first embodiment of the invention.

In the drawings, depicted elements are not necessarily drawn to scale and like or similar elements may be designated by the same reference numeral throughout the several views.

Figure 1B:
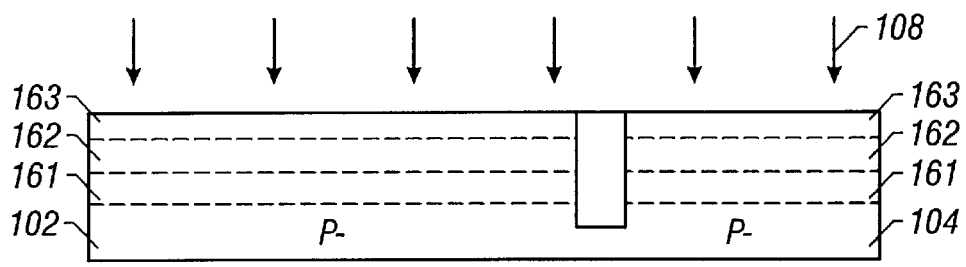
Figure 1C:
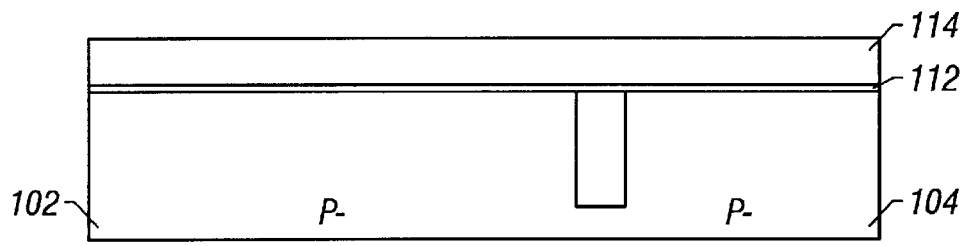
Figure 1D:
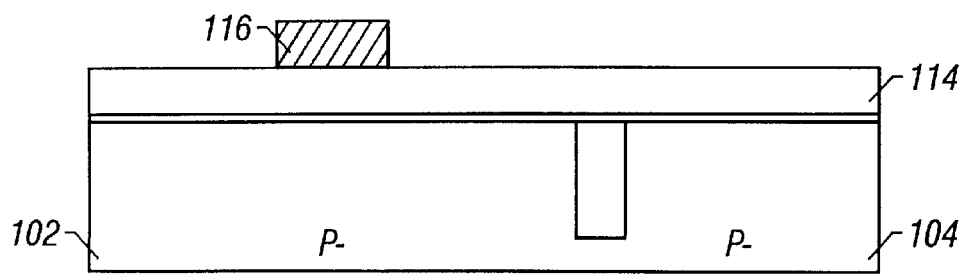
Figure 1E:
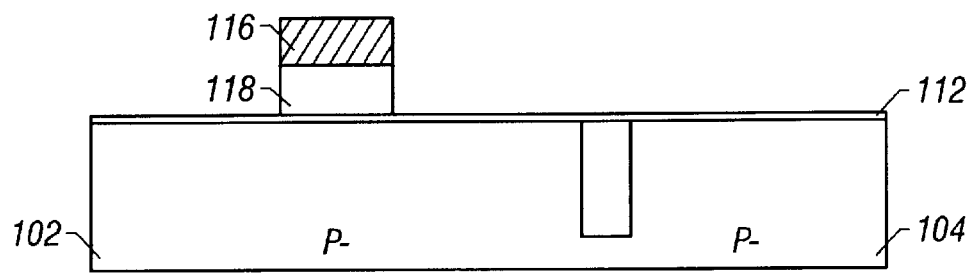
Figure 1F:
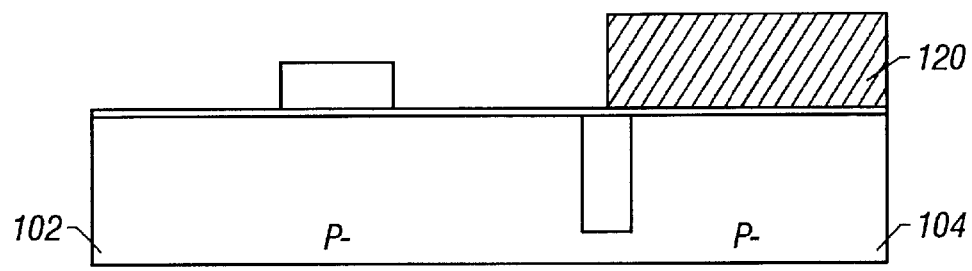
Figure 1G:
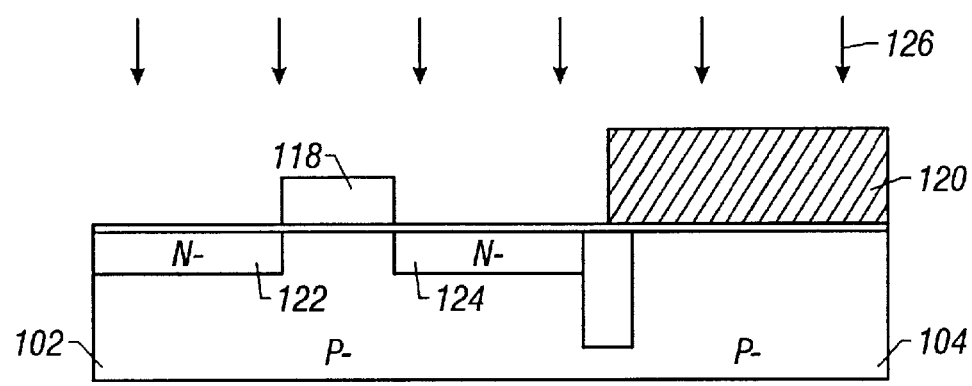
Figure 1H:
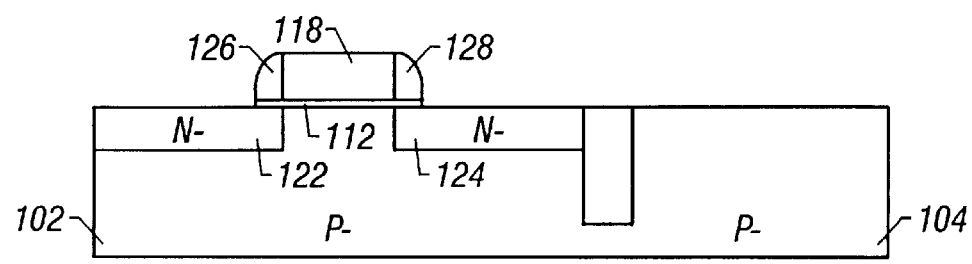
Figure 1I:
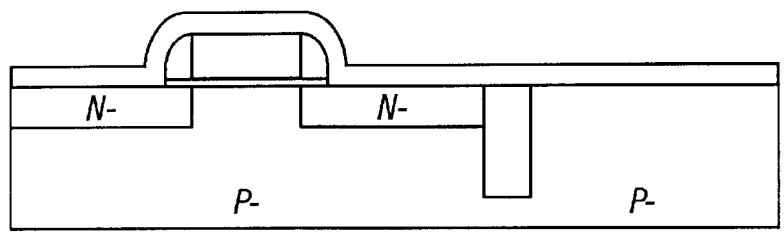
Figure 1J:
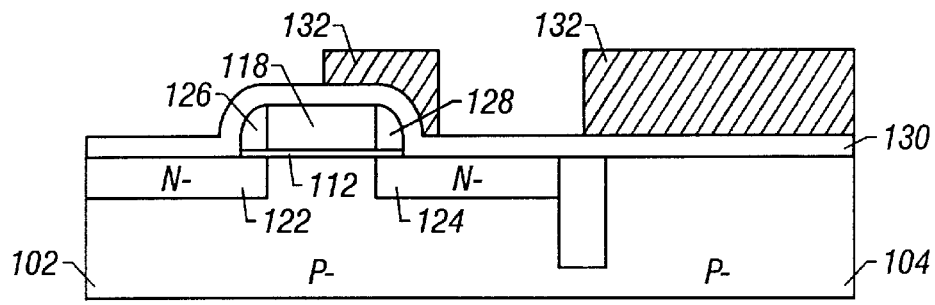
Figure 1K:
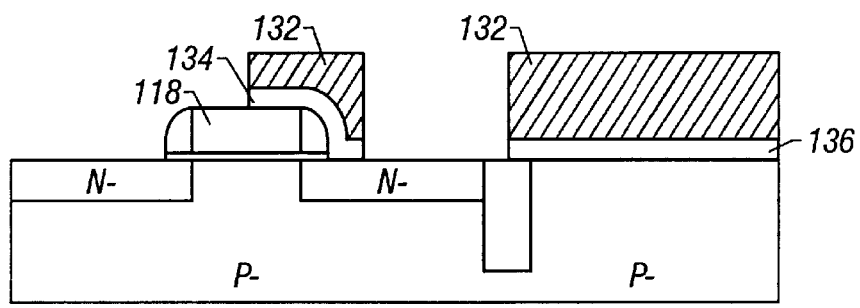
Figure 1L:
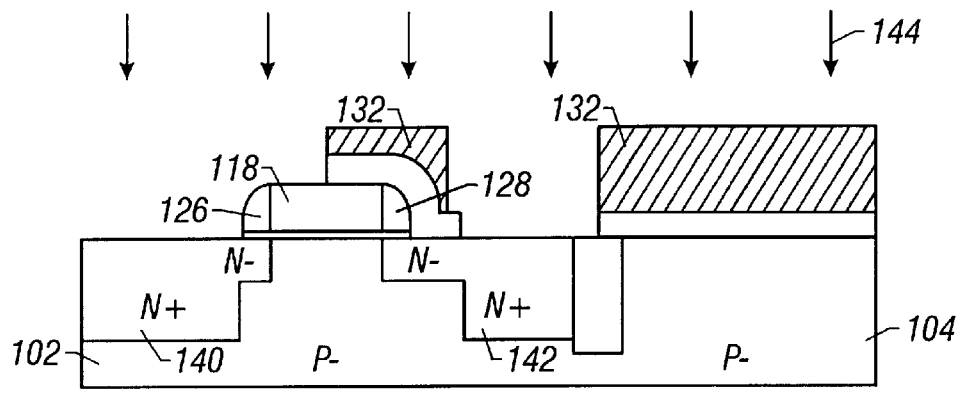
Figure 1M:
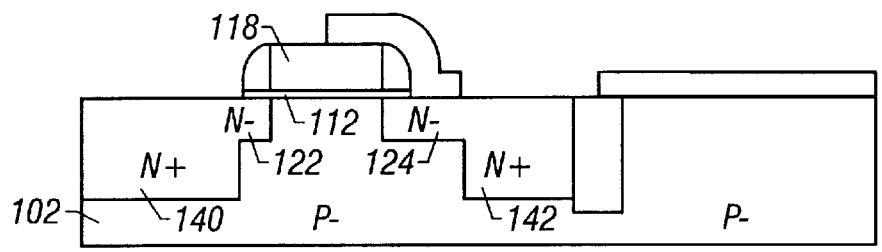
Figure 1N:
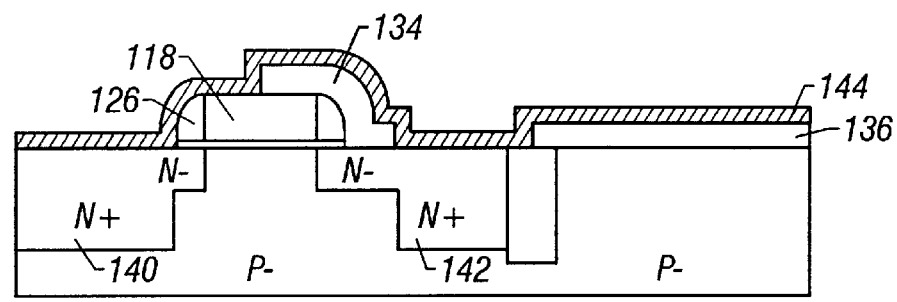
Figure 1O:
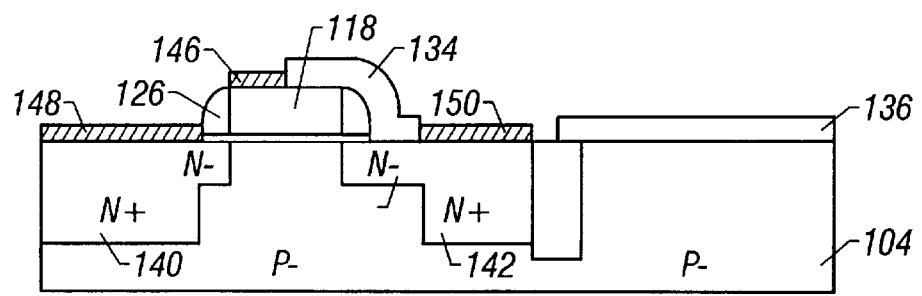

FIGS. 1A–1O show cross-sectional views of successive process steps for making an IGFET with a selectively doped gate in combination with a protected resistor in accordance with a first embodiment of the invention.

In FIG. 1A, a silicon substrate suitable for integrated circuit manufacture is provided. The substrate includes a P– type epitaxial surface layer on a P+ base layer (not shown). The epitaxial surface layer has a boron background concentration on the order of $1\times10^{15}$ atoms/cm$^3$, a <100> orientation and a resistivity of 12 ohm-cm. Active region 102 and resistor region 104 of the substrate are shown. Trench oxide 106 composed of silicon dioxide (SiO$_2$) is formed in the substrate and provides dielectric isolation between active region 102 and resistor region 104.

In FIG. 1B, a well implant 161, punchthrough implant 162, and threshold adjust implant 163 are applied sequentially into active region 102 and resistor region 104. Although these implant steps are collectively represented by arrows 108, the three implants occur separately and in sequence. The well implant 161 is provided by subjecting the structure to ion implantation of boron at a dose in the range of $1\times10^{12}$ to $1\times10^{13}$ atoms/cm$^2$ and an energy in the range of 100 to 170 kiloelectron-volts, the punchthrough implant 162 is provided by subjecting the structure to ion implantation of boron at a dose in the range of $1\times10^{12}$ to $1\times10^{13}$ atoms/cm$^2$ and an energy in the range of 40 to 100 kiloelectron-volts, and the threshold adjust implant 163 is provided by subjecting the structure to ion implantation of boron at a dose in the range of $1\times10^{12}$ to $1\times10^{13}$ atoms/cm$^2$ and an energy in the range of 2 to 30 kiloelectron-volts. Active region 102 and resistor region 104 continue to be doped P– with an increased boron background concentration on the order of about $1\times10^{16}$ atoms/cm$^3$.

Well implants, punchthrough implants, and threshold adjust implants are often used in the fabrication of IGFETs. In active region 102, the well implant provides a more uniform background doping, the punchthrough implant provides the channel with greater robustness to punchthrough voltages by laterally widening of the drain-depletion region below the top surface of the substrate, and the threshold voltage implant shifts the threshold voltage towards a desired value such as 0.4 to 0.7 volts. Typically the threshold adjust implant has a peak concentration near the top surface of the substrate, the punchthrough implant has a peak concentration near the bottom of the source and drain, the well implant has a peak concentration below the source and drain. In resistor region 104, the well implant, punchthrough implant and threshold adjust implant provide suitable doping for a diffused resistor therein.

In FIG. 1C, a blanket layer of gate oxide 112 composed of silicon dioxide is formed on the top surface of active region 102 and resistor region 104 using tube growth at a temperature of 700 to 1000° C. in an O$_2$ containing ambient. Gate oxide 112 has a thickness in the range of 30 to 100 angstroms. Thereafter, polysilicon layer 114 is deposited by low pressure chemical vapor deposition on the top surface of gate oxide 112. Polysilicon layer 114 has a thickness of 2000 angstroms. Preferably, polysilicon layer 114 is doped before the initial source/drain implant step. For instance, polysilicon layer 114 can be doped in situ as deposition occurs, or doped before a subsequent etch step by implanting arsenic with a dosage in the range of $1\times10^{15}$ to $5\times10^{15}$ atoms/cm$^2$ and an energy in the range of 2 to 10 kiloelectron-volts.

In FIG. 1D, photoresist layer 116 is deposited on polysilicon layer 114. A photolithographic system, such as a step and repeat optical projection system which generates deep ultraviolet light from a mercury-vapor lamp, uses a first reticle to irradiate photoresist layer 116 with a first image pattern. Thereafter, the irradiated portions of photoresist layer 116 are removed, and photoresist layer 116 includes openings above selected portions of active region 102 and includes an opening above the entire resistor region 104.

In FIG. 1E, an anisotropic dry etch is applied using photoresist layer 116 as an etch mask. Photoresist layer 116 protects the underlying regions of polysilicon layer 114, and the etch removes the regions of polysilicon layer 114 beneath the openings in photoresist layer 116. The etch is highly selective of polysilicon with respect to silicon dioxide, so only a negligible amount of gate oxide 112 beneath the openings in photoresist layer 116 is removed and the substrate is unaffected. The etch forms polysilicon gate 118 from the unetched portion of polysilicon layer 114 over active region 102. Gate 118 has opposing vertical sidewalls separated by a length of 3500 angstroms, and a thickness (or height above the underlying gate oxide 112) of 2000 angstroms. No polysilicon remains above resistor region 104.

In FIG. 1F, photoresist layer 116 is removed, and photoresist layer 120 is deposited over the substrate. The photolithographic system uses a second reticle to irradiate photoresist layer 120 with a second image pattern, the irradiated portions of photoresist layer 120 are removed, and photoresist layer 120 includes an opening above active region 102 and covers resistor region 104. Although photoresist layer 120 constitutes an additional masking step in an NMOS process, in a CMOS process photoresist layer 120 would normally be necessary as an implant mask for P-channel devices (not shown) being fabricated in other active regions of the substrate, and therefore would not constitute an additional masking step.

In FIG. 1G, lightly doped source and drain regions 122 and 124 are implanted into active region 102 by subjecting the structure to ion implantation of phosphorus, indicated by arrows 126, at a dose in the range of $1 \times 10^{13}$ to $5 \times 10^{14}$ atoms/cm$^2$ and an energy of 2 to 35 kiloelectron-volts, using gate 118 as an implant mask for active region 102 and using photoresist layer 120 as an implant mask for resistor region 104. As a result, lightly doped source/drain regions 122 and 124 are implanted into active region 102 outside gate 118 and are substantially aligned with the opposing sidewalls of gate 118. Lightly doped source/drain regions 122 and 124 are doped N− with a phosphorus concentration in the range of about $1 \times 10^{17}$ to $1 \times 10^{18}$ atoms/cm$^3$.

In FIG. 1H, photoresist layer 120 is removed, and an oxide layer with a thickness of 1000 angstroms is conformally deposited over the exposed surfaces by plasma enhanced chemical vapor deposition at a temperature in the range of 300 to 450° C. Thereafter, the entire oxide layer is subjected to an anisotropic etch, such as a reactive ion etch, that is highly selective of silicon dioxide with respect to silicon and polysilicon. The anisotropic etch forms oxide spacers 126 and 128 from the unetched portions of the oxide layer. Spacers 126 and 128 are adjacent to the opposing sidewalls of gate 118 and laterally extend about 700 angstroms across lightly doped source and drain regions 122 and 124, respectively. The anisotropic etch removes gate oxide 112 above portions of active region 102 outside gate 118 and spacers 126 and 128, and removes gate oxide 112 above resistor region 104. The anisotropic etch also removes a slight amount (not shown) of trench oxide 106. However, the etch has no appreciable affect on gate 118 or the substrate.

In FIG. 1I, silicon oxynitride ($Si_xO_yN_z$) layer 130 with a thickness of 1000 angstroms is conformally deposited over the exposed surfaces by plasma enhanced chemical vapor deposition at a temperature in the range of 300 to 450° C.

In FIG. 1J, photoresist layer 132 is deposited on oxynitride layer 130. The photolithographic system uses a third reticle to irradiate photoresist layer 132 with a third image pattern, and the irradiated portions of photoresist layer 132 are removed. Photoresist layer 132 includes an opening above lightly doped source region 122 and spacer 126 and a first portion of gate 118, and includes another opening above lightly doped drain region 124. Photoresist layer 132 covers a second portion of gate 118, spacer 128, and resistor region 104. The first and second portions of gate 118 are approximately equally sized halves of gate 118 above active region 102.

In FIG. 1K, the structure is subjected to an anisotropic etch, such as a reactive ion etch, that is highly selective of silicon oxynitride with respect to silicon dioxide, silicon and polysilicon, using photoresist layer 132 as an etch mask. The anisotropic etch completely removes the portions of oxynitride layer 130 beneath the openings in photoresist layer 132, however the etch has no appreciable affect on the portions of oxynitride layer 130 beneath photoresist layer 132 or on the materials beneath the removed oxynitride. As a result, the unetched portion of oxynitride layer 130 on the second portion of gate 118 forms gate-protect oxynitride 134, and the unetched portion of oxynitride layer 130 on resistor region 104 forms resistor-protect oxynitride 136. As is seen, the first portion of gate 118 is exposed. Of importance, gate-protect oxynitride 134 (which selectively exposes the first portion of the gate) and resistor-protect oxynitride 136 are formed from the same insulating layer, using a single photoresist layer and etch step, thereby requiring fewer process steps than conventional approaches in which the resistor-protect insulator is formed from a separate insulating layer using a separate photoresist mask and etch step after forming the source and the drain.

In FIG. 1L, heavily doped source and drain regions 140 and 142 are implanted into active region 102 by subjecting the structure to ion implantation of arsenic, indicated by arrows 144, at a dose in the range of $1 \times 10^{15}$ to $5 \times 10^{15}$ atoms/cm$^2$ and an energy of 10 to 80 kiloelectron-volts, using the first portion of gate 118 and spacer 126 and photoresist layer 132 as an implant mask for active region 102, and using photoresist layer 132 as an implant mask for the second portion of gate 118 and for resistor region 104. As a result, heavily doped source/drain regions 140 and 142 are implanted into active region 102, are self-aligned to the edge of spacer 126 and the edge of photoresist layer 132 near spacer 128, and are displaced from the opposing sidewalls of gate 118. Heavily doped source and drain regions 140 and 142 are doped N+ with an arsenic concentration in the range of about $1 \times 10^{18}$ to $1 \times 10^{20}$ atoms/cm$^3$.

Since the first portion of gate 118 is exposed to the arsenic implant but the second portion of gate 118 is not, the first portion of gate 118 is more heavily doped than the second portion of gate 118. Accordingly, gate 118 is selectively doped. That is, the doping concentration in gate 118 is adjusted by selectively exposing gate 118 during a source/drain doping step. Since the doping concentration in gate 118 affects the threshold voltage, photoresist layer 132 not only defines the resistor-protect insulator, but also affects the threshold voltage.

In FIG. 1M, photoresist layer 132 is removed, and the device is annealed to remove crystalline damage and to drive-in and activate the implanted dopants by applying a rapid thermal anneal on the order of 950 to 1050° C. for 10 to 60 seconds. As a result, an N-channel IGFET is formed with a source (consisting of source regions 122 and 140) and a drain (consisting of drain regions 124 and 142) controlled by gate 118.

Since the dopants diffuse both vertically and laterally, lightly doped source and drain regions 122 and 124 form channel junctions that extend slightly beneath the opposing sidewalls of gate 118. Arsenic tends to diffuse slowly in single crystal silicon, so little diffusion of heavily doped source and drain regions 140 and 142 occurs. In polysilicon, however, the diffusion constants at the grain boundaries are significantly higher than those in the single crystal regions. Thus, the dopants are capable of diffusing much more rapidly along the grain boundaries than through crystallites. As a result, the arsenic and phosphorus in gate 118 (including the arsenic implanted only into the first portion of gate 118) tend to redistribute throughout gate 118 and provide gate 118 with a relatively uniform doping concentration. Advantageously, no appreciable amount of arsenic or phosphorus in gate 118 diffuses through gate oxide 112 into active region 102, thereby assuring that the IGFET is an enhancement-mode device.

In FIG. 1N, titanium layer 144 with a thickness in the range of 100 to 350 angstroms is deposited over the substrate. Preferably, titanium layer 144 is deposited directly on the first portion of gate 118 and heavily doped source and drain regions 140 and 142 without any intervening native oxide. Titanium layer 144 is also deposited on spacer 126, gate-protect oxynitride 134 and resistor-protect oxynitride 136.

In FIG. 1O, a rapid thermal anneal on the order of 700° C. for 30 seconds is applied in a nitrogen ambient to convert portions of titanium layer 144 over the first portion of gate 118, heavily doped source region 140 and heavily doped drain region 142 into titanium suicide contacts 146, 148 and 150, respectively. The portions of titanium layer 144 on spacer 126, gate-protect oxynitride 134 and resistor-protect oxynitride 136 remain unreacted. Thereafter, the unreacted titanium (including titanium nitride) is stripped, and a subsequent anneal at 750 to 800° C. for 30 seconds is applied to lower the resistivity of titanium silicide contacts 146, 148 and 150. Titanium silicide contacts 146, 148 and 150 have a thickness of 200 to 600 angstroms and are separated from one another. Although titanium silicide contact 146 is formed on only the first portion of gate 118, it contacts a sufficiently large region of gate 118 to provide a low resistance ohmic contact. Moreover, resistor-protect oxynitride 136 has sufficient thickness to assure that it is not consumed by the silicidation process. Accordingly, no titanium silicide is formed on resistor region 104 beneath resistor-protect oxynitride 136.

Figure 2A:
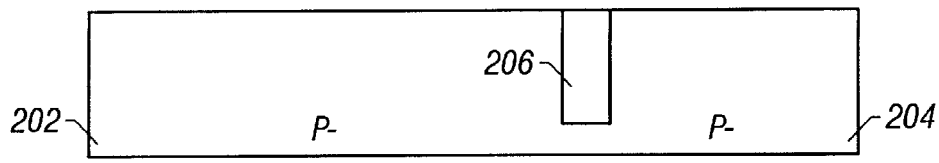
FIGS. 2A–2O show cross-sectional views of successive process steps for making an IGFET with a selectively doped gate in combination with a protected resistor in accordance with a second embodiment of the invention
Figure 2B:
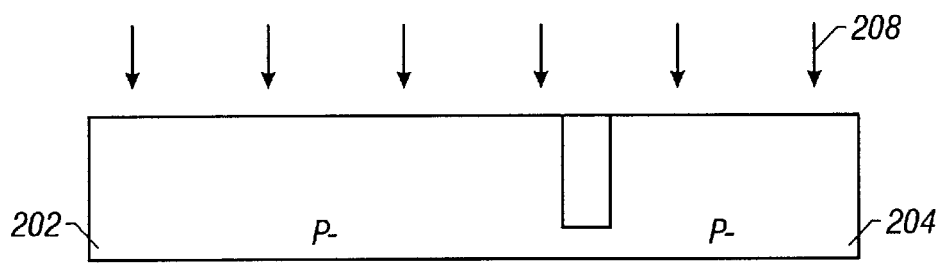
Figure 2C:
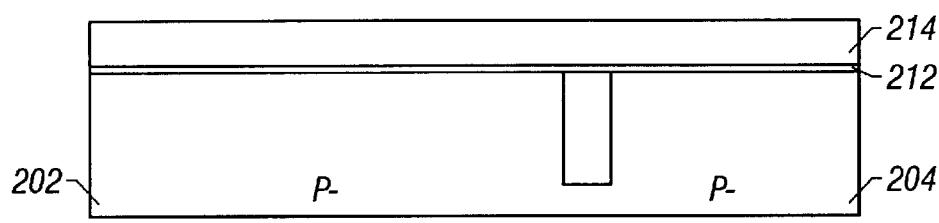
Figure 2D:
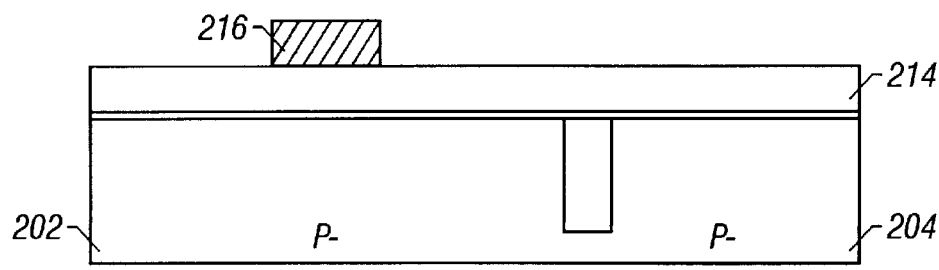
Figure 2E:
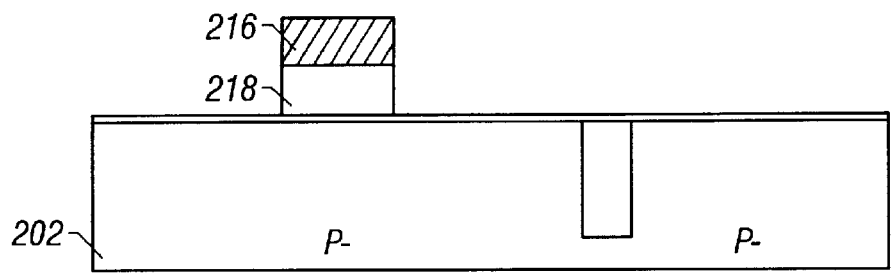
Figure 2F:
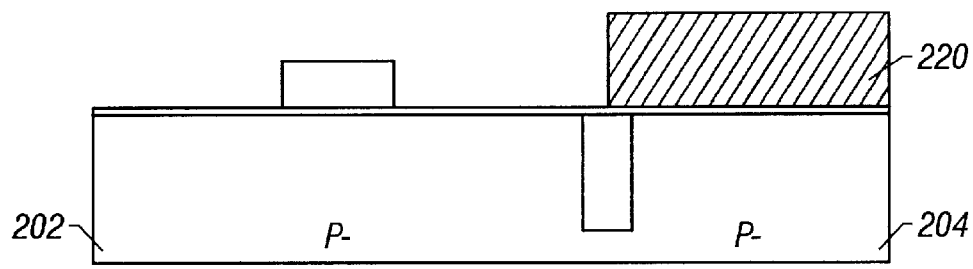
Figure 2G:
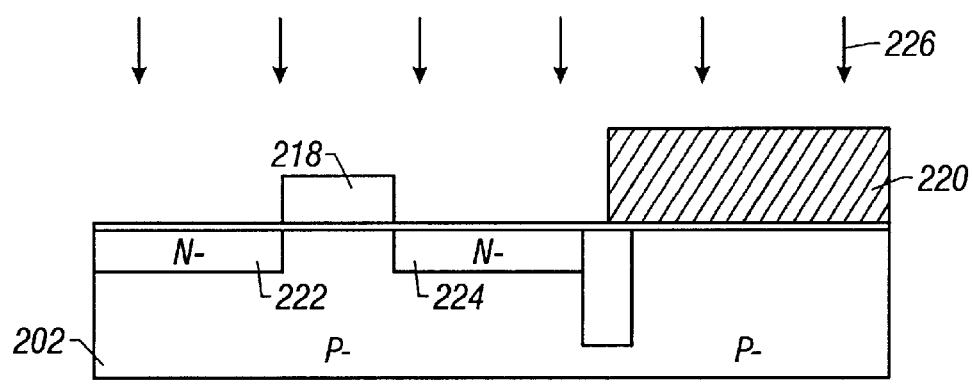
Figure 2H:
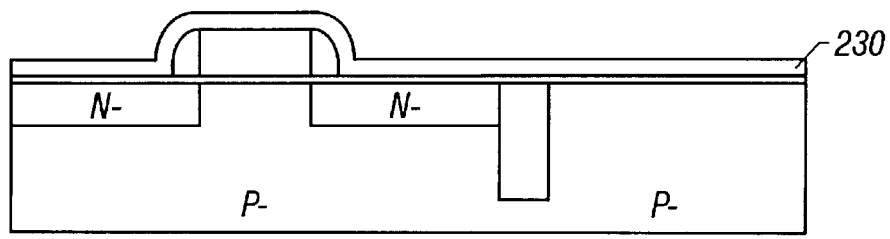
Figure 2I:
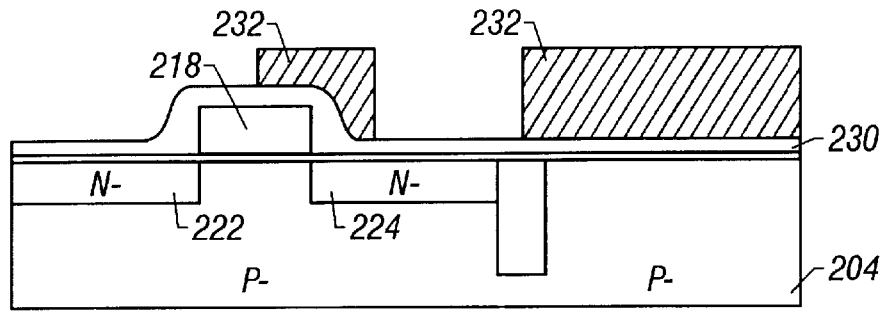
Figure 2J:
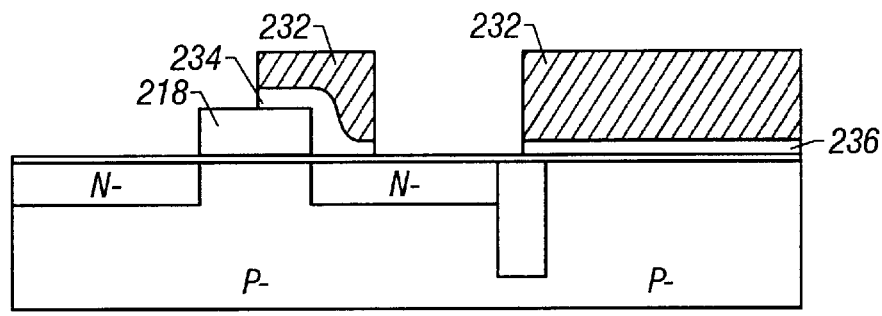
Figure 2K:
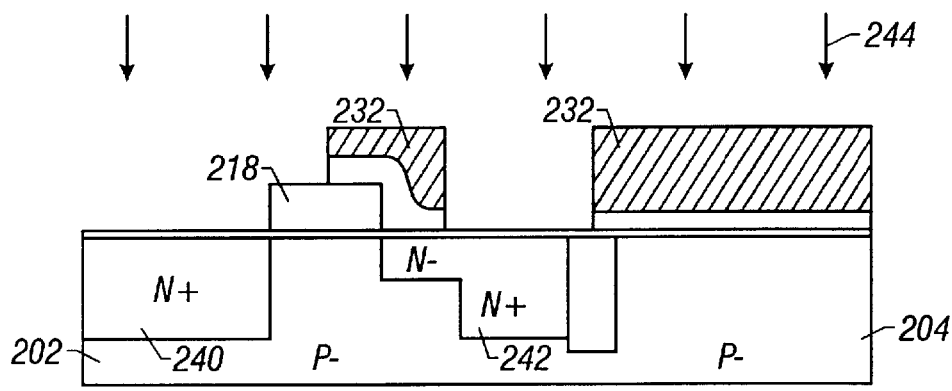
Figure 2L:
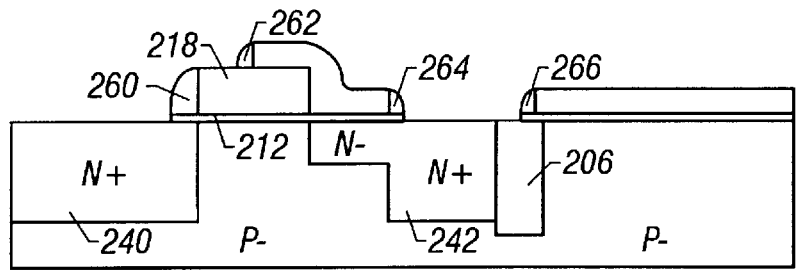
Figure 2M:
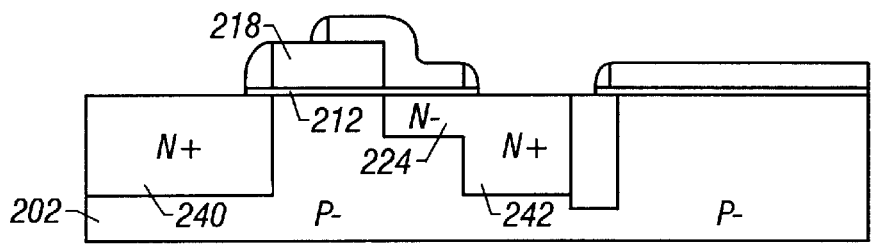
Figure 2N:
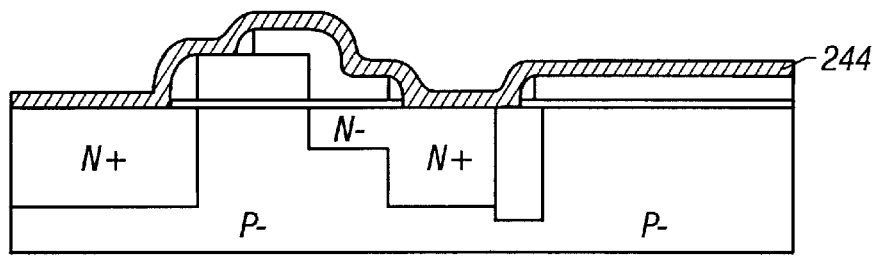
Figure 2O:
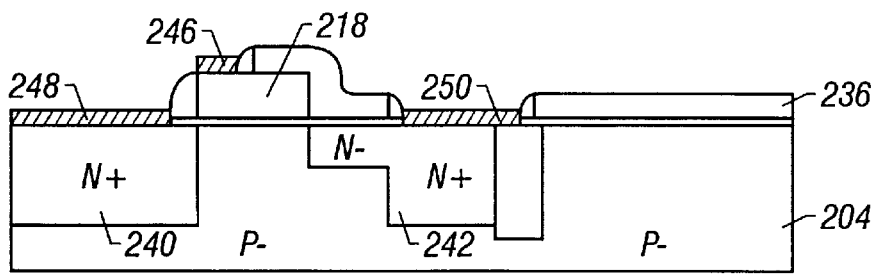

FIGS. 2A–2O show cross-sectional views of successive process steps for making an IGFET with a selectively doped gate in combination with a protected resistor in accordance with a second embodiment of the invention. In the first embodiment, a symmetrical transistor is formed in which the source includes a lightly doped source region. However, the lightly doped source region may not be necessary unless bidirectional current is used. Lightly doped regions are typically formed for both the source and drain to avoid additional processing steps needed to eliminate the lightly doped source region without eliminating the lightly doped drain region Advantageously, the second embodiment forms an asymmetrical device without more processing steps than the first embodiment. The second embodiment accomplishes this by forming the resistor-protect insulator before any spacers are formed. Unless otherwise noted, the elements for the second embodiment (e.g., active region 202, gate oxide 212, etc.) are similar to elements of the first embodiment (e.g., active region 102, gate oxide 112, etc.), and the description of related elements and process steps need not be repeated.

In FIG. 2A, a silicon substrate suitable for integrated circuit manufacture is provided. The substrate includes active region 202 and resistor region 204 separated by and adjacent to trench oxide 206.

In FIG. 2B, active region 202 and resistor region 204 are subjected to a well implant, a punchthrough implant, and threshold adjust implant collectively represented by arrows 208.

In FIG. 2C, gate oxide 212 is grown on active region 202 and resistor region 204, polysilicon layer 214 is deposited on gate oxide 212, and polysilicon layer 214 is doped using ion implantation.

In FIG. 2D, photoresist layer 216 is deposited on polysilicon layer 214 and patterned to include openings above selected portions of active region 202 and the entire resistor region 204.

In FIG. 2E, an anisotropic dry etch is applied using photoresist layer 216 as an etch mask to remove the regions of polysilicon layer 214 beneath the openings in photoresist layer 216 and form polysilicon gate 218 from the unetched portion of polysilicon layer 214 over active region 202.

In FIG. 2F, photoresist layer 216 is removed, and photoresist layer 220 is deposited over the substrate and patterned to include an opening above active region 202 and cover resistor region 204.

In FIG. 2G, lightly doped source and drain regions 222 and 224 are implanted into active region 202 by subjecting the structure to ion implantation of phosphorus, indicated by arrows 226, using gate 218 as an implant mask for active region 202 and using photoresist layer 220 as an implant mask for resistor region 204. Lightly doped source and drain regions 222 and 224 are doped N– and are substantially aligned with the opposing sidewalls of gate 218.

In FIG. 2H, photoresist layer 220 is removed, and silicon oxynitride layer 230 is conformally deposited over the exposed surfaces.

In FIG. 2I, photoresist layer 232 is deposited on oxynitride layer 230 and patterned so that it includes an opening over a first portion of gate 218 and all of lightly doped source region 222, includes another opening over a portion of lightly doped drain region 224 spaced from a second portion of gate 218, covers the second portion of gate 218 and an adjacent portion of lightly doped drain region 224, and covers resistor region 204.

In FIG. 2J, the structure is subjected to an anisotropic etch that is highly selective of silicon oxynitride with respect to silicon dioxide, silicon and polysilicon, using photoresist layer 232 as an etch mask. The anisotropic etch completely removes the portions of oxynitride layer 230 beneath the openings in photoresist layer 232. The unetched portion of oxynitride layer 230 on the second portion of gate 218 forms gate-protect oxynitride 234, and the unetched portion of oxynitride layer 230 on resistor region 204 forms resistor-protect oxynitride 236. As is seen, the first portion of gate 218 is exposed.

In FIG. 2K, heavily doped source and drain regions 240 and 242 are implanted into active region 202 by subjecting the structure to ion implantation of arsenic, indicated by arrows 244, using the first portion of gate 218 and photoresist layer 232 as an implant mask for active region 202, and using photoresist layer 232 as an implant mask for the second portion of gate 218 and for resistor region 204. As a result, heavily doped source and drain regions 240 and 242 are doped N+. Heavily doped source region 240 encompasses and eliminates lightly doped source region 222, and is substantially aligned with the sidewall of gate 218 in the first portion of gate 218. Furthermore, since the first portion of gate 218 is exposed to the arsenic implant but the second portion of gate 218 is not, the first portion of gate 218 is more heavily doped than the second portion of gate 218. In this manner, gate 218 is selectively doped and asymmetrical source/drain doping is provided.

In FIG. 2L, photoresist layer 232 is removed, and an oxide layer with a thickness of 1000 angstroms is conformally deposited over the exposed surfaces by plasma enhanced chemical vapor deposition at a temperature in the range of 300 to 450° C. Thereafter, the entire oxide layer is subjected to an anisotropic etch, such as a reactive ion etch, that is highly selective of silicon dioxide with respect to silicon oxynitride, silicon and polysilicon. The anisotropic etch forms oxide spacers 260, 262, 264 and 266 from the unetched portions of the oxide layer. Spacer 260 is formed over heavily doped source region 240, spacer 262 is formed over the first portion of gate 218, spacer 264 is formed over heavily doped drain region 242, and spacer 266 is formed over heavily doped drain region 242 and trench oxide 206. Spacer 260 laterally extends about 700 angstroms across the substrate, and spacers 262, 264 and 266 each laterally extend about 300 to 500 angstroms across the substrate. The anisotropic etch removes gate oxide 212 above active region 202 outside gate 218, gate-protect oxynitride 234, and spacers 260, 264 and 266. However, the etch has no appreciable affect on gate 218 or the substrate.

In FIG. 2M, the device is annealed to remove crystalline damage and to drive-in and activate the implanted dopants by applying a rapid thermal anneal on the order of 950 to 1050° C. for 10 to 60 seconds. As a result, an N-channel IGFET is formed with a source (consisting of source region 240) and a drain (consisting of drain regions 224 and 242) controlled by gate 218.

Since the dopants diffuse both vertically and laterally, heavily doped source region 240 and lightly doped drain region 224 form channel junctions that extend slightly beneath the opposing sidewalls of gate 218. In gate 218, the implanted dopants (including the arsenic implanted only into the first portion of gate 218) tend to redistribute throughout gate 218 and provide gate 218 with a relatively uniform doping concentration Advantageously, no appreciable amount of arsenic or phosphorus in gate 218 diffuses through gate oxide 212 into active region 202, thereby assuring that the IGFET is an enhancement-mode device.

In FIG. 2N, titanium layer 244 is deposited over the substrate.

In FIG. 2O, a rapid thermal anneal is applied in a nitrogen ambient to convert portions of titanium layer 244 over gate 218, heavily doped source region 240 and heavily doped drain region 242 into titanium suicide contacts 246, 248 and 250, respectively. Thereafter, the unreacted titanium (including titanium nitride) is stripped, and a subsequent anneal is applied to lower the resistivity of titanium silicide contacts 246, 248 and 250. Although titanium silicide contact 246 is adjacent to only about 1200 angstroms gate 218 lengthwise, it contacts a sufficiently large region of gate 218 to provide a low resistance ohmic contact. Moreover, no titanium silicide is formed on resistor region 204 beneath resistor-protect oxynitride 236.

Further processing steps in the fabrication of IGFETs typically include forming a thick oxide layer over the active regions, forming contact windows (or vias) in the oxide layer to expose the silicide contacts, forming conductive plugs in the contact windows, forming a metal-1 pattern such as aluminum to selectively interconnect the conductive plugs, forming additional layers of interlevel dielectrics, conductive plugs and metal patterns, and forming a passivation layer over the structure. In addition, earlier or subsequent high-temperature process steps can be used to supplement or replace the anneal steps to provide the desired anneal, activation, and drive-in functions. These further processing steps are conventional. Likewise the principal processing steps disclosed herein may be combined with other steps apparent to those skilled in the art.

The present invention includes numerous variations to the embodiments described above. For instance, the punch-through and threshold adjust implants may not be essential. Likewise, the source and drain need not necessarily include lightly doped regions, the gate need not necessarily be doped before the source/drain doping steps, and silicide contacts need not necessarily be formed. The spacers can be formed in close proximity to the sidewalls of the gate by forming the spacers adjacent to the sidewalls or by forming a thin dielectric layer on the gate and then forming the spacers on the thin dielectric layer.

The masking layer (e.g., photoresist layers 132 and 232) can be removed before implanting the heavily doped source and drain regions, in which case the gate-protect insulator and the resistor-protect insulator can provide implant masks for the underlying regions. The masking layer can expose any suitable portion of the gate to be selectively doped during a subsequent source/drain doping step. Moreover, the masking layer can expose different portions of different gates so that different devices have different threshold voltages. For instance, the masking layer can completely cover a first gate, partially cover a second gate, and completely expose a third gate so that a subsequent source/drain doping step provides the least doping in the first gate and the most doping in the third gate.

The diffused resistor can be doped by ion implantation of solid phase diffusion, and can have the same or opposite conductivity type as the substrate. In some instances, it may be desirable to dope the diffused resistor differently than the P-wells or N-wells to obtain a particular resistance. For instance, the diffused resistor can be doped like the lightly doped source and drain regions using the same implant step. Furthermore, the active region and resistor region can be adjacent to one another (without any dielectric isolation in between), particularly when a heavily doped source/drain region has a different conductivity type than the adjacent diffused resistor. The entire diffused resistor can be covered by the resistor-protect insulator, or alternatively, small portions of the diffused resistor can remain uncovered. For instance, it may be desirable to form silicide contacts on the terminal ends of the diffused resistor.

The gate material can be various conductors, the gate insulator and gate-protect insulator and resistor-protect insulator and spacers can be various dielectrics such as silicon dioxide, silicon nitride, silicon oxynitride, or combinations (including layers) thereof, and the silicide contacts can be formed from various refractory metals. Generally, the gate-protect insulator and the resistor-protect insulator are a different material than the spacers to provide for selective etching. Other masking layers besides photoresist can be employed, such as silicon nitride patterned using photolithography. Other dielectric isolation techniques such as LOCOS oxidation can be used. Suitable N-type dopants include arsenic and phosphorus; suitable P-type dopants include boron $B_{10}$, boron $B_{11}$, and $BF_X$ species such as $BF_2$.

The invention is particularly well-suited for fabricating N-channel MOSFETs, P-channel MOSETs and other types of IGFETs, particularly for high-performance microprocessors where high circuit density is essential. Although a single N-channel device and diffused resistor have been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an IGFET with a selectively doped gate in combination with a protected resistor, the method comprising:

providing a semiconductor substrate with an active region and a resistor region;

forming a gate over the active region;

forming a diffused resistor in the resistor region;

forming an insulating layer over the active region and the resistor region;

forming a masking layer over the insulating layer, wherein the masking layer includes an opening above a first portion of the gate and covers the resistor region and a second portion of the gate;

applying an etch using the masking layer as an etch mask to remove the insulating layer above the first portion of the gate, wherein an unetched portion of the insulating layer forms a gate-protect insulator over the second portion of the gate and another unetched portion of the insulating layer forms a resistor-protect insulator over the diffused resistor; and forming a source and a drain in the active region, including at least partially doping the source and the drain during a doping step that provides more doping for the first portion of the gate than for the second portion of the gate after forming the masking layer.

2. The method of claim 1, wherein the diffused resistor is doped by solid phase diffusion.

3. The method of claim 1, wherein the diffused resistor is doped by ion implantation.

4. The method of claim 1, wherein the diffused resistor is doped before providing any doping for the source and the drain.

5. The method of claim 1, wherein the diffused resistor is doped simultaneously with doping the source and the drain.

6. The method of claim 1, wherein the active region and the resistor region are adjacent to one another.

7. The method of claim 1, wherein the active region and the resistor region are separated from one another and adjacent to a dielectric isolation region in the substrate.

8. The method of claim 1, including using the masking layer as an implant mask for the second portion of the gate and the diffused resistor during the doping step.

9. The method of claim 1, including using the gate-protect insulator as an implant mask for the second portion of the gate during the doping step and using the resistor-protect insulator as an implant mask for the diffused resistor during the doping step.

10. The method of claim 1, including:

depositing a conformal layer of spacer material over the substrate; and applying an anisotropic etch to all of the spacer material to form spacers from unetched portions of the spacer material over the active region.

11. The method of claim 10, including forming the masking layer before forming the spacers.

12. The method of claim 10, including forming the masking layer after forming the spacers.

13. The method of claim 10, including the following steps in the sequence set forth:

forming the gate;

implanting lightly doped source and drain regions into the active region;

forming the spacers in close proximity to opposing sidewalls of the gate;

forming the gate-protect insulator and the resistor-protect insulator; and implanting heavily doped source and drain regions into the active region during the doping step;

wherein the source and the drain include the lightly and heavily doped source and drain regions, the lightly doped source and drain regions provide channel junctions and the heavily doped source and drain regions are displaced from the channel junctions.

14. The method of claim 10, including the following steps in the sequence set forth:

forming the gate;

implanting lightly doped source and drain regions into the active region;

forming the gate-protect insulator and the resistor-protect insulator; implanting heavily doped source and drain regions into the active region; and forming the spacers;

wherein the source includes the heavily doped source region, the drain includes the lightly and heavily doped drain regions, the heavily doped source region and the lightly doped drain region provide channel junctions and the heavily doped drain region is displaced from the channel junctions.

15. The method of claim 1, including:

depositing a refractory metal over the gate, the source, the drain, the gate-protect insulator and the resistor-protect insulator; and applying a thermal cycle to form silicide contacts on the gate, the source and the drain.

16. The method of claim 15, including stripping the refractory metal between the silicide contacts.

17. The method of claim 15, wherein essentially no silicide forms on the diffused resistor beneath the resistor-protect insulator.

18. The method of claim 1, wherein the gate is polysilicon and the masking layer is photoresist.

19. A method of making an IGFET with a selectively doped gate in combination with a protected resistor, the method comprising:

providing a semiconductor substrate with an active region and a resistor region;

forming a diffused resistor in the resistor region;

forming a gate insulator on the active region;

forming a gate on the gate insulator and over the active region;

implanting lightly doped source and drain regions into the active region during a first implant step;

forming first and second spacers adjacent to first and second opposing sidewalls of the gate, wherein the first spacer is above the lightly doped source region and the second spacer is above the lightly doped drain region;

forming an insulating layer over the active region and the resistor region after forming the spacers;

forming a masking layer over the insulating layer, wherein the masking layer includes an opening above a first portion of the gate and the first spacer and the lightly doped source region, the masking layer includes another opening above the lightly doped drain region, and the masking layer covers the resistor region and a second portion of the gate and the second spacer;

applying an etch using the masking layer as an etch mask to remove the insulating layer beneath the openings in the masking layer, wherein an unetched portion of the insulating layer forms a gate-protect insulator over the gate, and another unetched portion of the insulating layer forms a resistor-protect insulator over the diffused resistor;

implanting heavily doped source and drain regions into the active region during a second implant step, wherein the second implant step provides more doping for the first portion of the gate than for the second portion of the gate;

forming a source and a drain, wherein the source includes the lightly and heavily doped source regions and the drain includes the lightly and heavily doped drain regions;

depositing a refractory metal over the gate, the source, the drain, the gate-protect insulator and the resistor-protect insulator; and applying a thermal cycle to form silicide contacts on the gate, the source and the drain.

20. The method of claim 19, wherein the lightly doped source and drain regions provide channel junctions, and the heavily doped source and drain regions are displaced from the channel junctions.

21. The method of claim 19, wherein:
the gate provides an implant mask for the active region during the first implant step; and
the masking layer provides an implant mask for the second portion of the gate and the diffused resistor during the second implant step.

22. The method of claim 19, wherein the gate is polysilicon, the gate insulator is silicon dioxide, the insulating layer is selected from the group consisting of silicon dioxide, silicon nitride, silicon oxynitride and combinations thereof, and the masking layer is photoresist.

23. The method of claim 19, wherein the steps are performed in the sequence set forth.

24. A method of making an IGFET with a selectively doped gate in combination with a protected resistor, the method comprising:
providing a semiconductor substrate with an active region and a resistor region;
forming a diffused resistor in the resistor region;
forming a gate insulator on the active region;
forming a gate on the gate insulator and over the active region;
implanting lightly doped source and drain regions into the active region during a first implant step;
forming an insulating layer over the active region and the resistor region after the first implant step, wherein the insulating layer is adjacent to first and second opposing sidewalls of the gate;
forming a masking layer over the insulating layer, wherein the masking layer includes an opening above a first portion of the gate and the lightly doped source region, the masking layer includes another opening above the lightly doped drain region, and the masking layer covers the resistor region and a second portion of the gate;
applying an etch using the masking layer as an etch mask to remove the insulating layer beneath the openings in the masking layer, wherein an unetched portion of the insulating layer forms a gate-protect insulator over the gate, and another unetched portion of the insulating layer forms a resistor-protect insulator over the diffused resistor;

implanting heavily doped source and drain regions into the active region during a second implant step, wherein the second implant step provides more doping for the first portion of the gate than for the second portion of the gate;

forming first, second and third spacers over the active region, wherein the first spacer is formed over the heavily doped source region, the second spacer is formed over the first portion of the gate, and the third spacer is formed over the heavily doped drain region;

forming a source and a drain, wherein the source includes the heavily doped source region and the drain includes the lightly and heavily doped drain regions;

depositing a refractory metal over the gate, the source, the drain, the gate-protect insulator and the resistor-protect insulator; and applying a thermal cycle to form silicide contacts on the gate, the source and the drain.

25. The method of claim 24, wherein the heavily doped source region and the lightly doped drain region provide channel junctions, and the heavily doped drain region is displaced from the channel junctions.

26. The method of claim 24, wherein:
the gate provides an implant mask for the active region during the first implant step; and
the masking layer provides an implant mask for the second portion of the gate and the lightly doped drain region and the diffused resistor during the second implant step.

27. The method of claim 26, wherein the gate is polysilicon, the gate insulator is silicon dioxide, the insulating layer is selected from the group consisting of silicon dioxide, silicon nitride, silicon oxynitride and combinations thereof, and the masking layer is photoresist.

28. The method of claim 26, wherein the steps are performed in the sequence set forth.

29. A method of making an IGFET with a selectively doped gate in combination with a protected resistor, the method comprising:
providing a semiconductor substrate with an active region and a resistor region of a first conductivity type;
forming a diffused resistor in the resistor region;
growing a gate oxide on the active region;
depositing a polysilicon layer on the gate oxide;
forming a first photoresist layer over the polysilicon layer;
etching the polysilicon layer through openings in the first photoresist layer using the first photoresist layer as an etch mask such that an unetched portion of the polysilicon layer over the active region forms a gate;
removing the first photoresist layer;
implanting lightly doped source and drain regions of a second conductivity type into the active region during a first implant step using the gate as an implant mask for the active region;
depositing a conformal layer of spacer material over the active region and the resistor region;
applying an anisotropic etch to the spacer material to form first and second spacers adjacent to first and second opposing sidewalls of the gate, wherein the first spacer is above the lightly doped source region and the second spacer is above the lightly doped drain region;
depositing an insulating layer over the active region and the resistor region;
forming a second photoresist layer over the insulating layer, wherein the second photoresist layer includes an opening above a first portion of the gate and the first spacer and the lightly doped source region, the second photoresist layer includes another opening above the lightly doped drain region, and the second photoresist layer covers a second portion of the gate and the second spacer and the diffused resistor;

etching the insulating layer through the openings in the second photoresist layer using the second photoresist layer as an etch mask, wherein an unetched portion of the insulating layer beneath the second photoresist layer forms a gate-protect insulator on the gate, and another unetched portion of the insulating layer beneath the second photoresist layer forms a resistor-protect insulator over the diffused resistor;

implanting heavily doped source and drain regions of the second conductivity type into the active region during a second implant step using the first spacer and the first portion of the gate and the second photoresist layer as an implant mask for the active region and using the second photoresist layer as an implant mask for the second portion of the gate and the diffused resistor, wherein the second implant step provides more doping for the first portion of the gate than for the second portion of the gate thereby selectively doping the gate;

removing the second photoresist layer;

applying a first thermal cycle to drive-in and activate implanted dopants in the active region, thereby forming a source that includes the lightly and heavily doped source regions and a drain that includes the lightly and heavily doped drain regions;

depositing a refractory metal over the active region and the resistor region after applying the first thermal cycle;

applying a second thermal cycle to react the refractory metal with the gate, the source and the drain, thereby forming silicide contacts on the gate, the source and the drain without forming essentially any silicide on the diffused resistor beneath the resistor-protect insulator; and stripping the unreacted refractory metal between the silicide contacts.

30. The method of claim 29, wherein the lightly doped source and drain regions provide channel junctions substantially aligned with the first and second sidewalls, respectively, and the heavily doped source and drain regions are displaced from the channel junctions.

31. The method of claim 29, wherein the diffused resistor is the first conductivity type.

32. The method of claim 29, wherein the spacer material and the insulating layer are different materials, and etching the insulating layer includes applying an etch that is highly selective of the insulating layer with respect to the spacer material.

33. The method of claim 29, wherein the steps are performed in the sequence set forth.

* * * * *